United States Patent [19]

Yoshinaka et al.

[11] 4,445,092
[45] Apr. 24, 1984

[54] PERIODIC PULSE FORMING CIRCUIT

[75] Inventors: Tadaaki Yoshinaka, Hadano; Takashi Takayama, Sagamihara, both of Japan

[73] Assignee: Sony Corporation, Tokyo, Japan

[21] Appl. No.: 303,991

[22] Filed: Sep. 21, 1981

[30] Foreign Application Priority Data

Sep. 30, 1980 [JP] Japan ................. 55-136849

[51] Int. Cl.³ .................. H03K 5/08; H03K 5/00
[52] U.S. Cl. .................. 328/139; 328/109; 328/147; 328/165; 455/223; 455/296
[58] Field of Search .............. 328/165, 139, 151, 147, 328/146, 109, 149; 455/222, 223, 296

[56] References Cited

U.S. PATENT DOCUMENTS

| | | | |
|---|---|---|---|
| 3,979,679 | 9/1976 | Bush et al. | 455/222 |
| 4,187,438 | 2/1980 | Mueller | 328/146 |
| 4,220,925 | 9/1980 | Wu | 328/146 |
| 4,301,541 | 11/1981 | Tanaka et al. | 328/165 |
| 4,358,738 | 11/1982 | Kahn | 328/165 |

FOREIGN PATENT DOCUMENTS 2748099  5/1979  Fed. Rep. of Germany ...... 455/223

*Primary Examiner*—John S. Heyman
*Assistant Examiner*—Timothy P. Callahan
*Attorney, Agent, or Firm*—Lewis H. Eslinger; Alvin Sinderbrand

[57] ABSTRACT

A periodic pulse forming circuit, for example, for use in a video tape recording and reproducing apparatus or VTR, for distinguishing valid horizontal sync signals from noise signals in a separated horizontal sync signal train from a reproduced video signal includes a sawtooth generator and a sample and hold circuit to produce a signal representing the interval between successive sync or noise pulses. Each sample from the sample and hold circuit is compared by a window comparator with a signal representing the average interval between successive pulses to establish whether the interval between successive pulses is within a predetermined range. If it is, the second pulse is passed by a gate but if it is not, the pulse is blocked. The noise pulse signals are thus removed. The circuit allows the reliable elimination of noise pulses even where the tape replay rate is varied for fast and slow motion reproduction.

13 Claims, 6 Drawing Figures

PERIODIC PULSE FORMING CIRCUIT

BACKGROUND OF THE INVENTION

1. Field of the Invention

This invention relates generally to a periodic pulse forming circuit, and in particular is directed to a circuit for separating periodic pulses from a series of pulses which includes noise pulses.

2. Description of the Prior Art

In a professional type video tape recorder or VTR, the reproduced video signal is usually supplied to a time base error corrector (TBC) to eliminate time base errors, such as jitter, from the reproduced video signal. In order to detect the time base errors, it is necessary to separate the horizontal sync signal from the reproduced video signal. However, noise signals are often contained in the reproduced video signal as shown in FIG. 1A of the accompanying drawings so that such noise signals are detected by the horizontal sync separator as false sync signals such as N as shown in FIG. 1B. It is apparent that the horizontal sync pulses H including the false sync signal N disturb the correction of time base errors by the TBC, because the time base error is not detected accurately due to the false sync pulse.

In order to avoid the above problem, a conventional TBC is provided with a gate signal generator, such as a monostable multivibrator, which generates a gate signal which occurs simultaneously with the next succeeding horizontal sync signal based upon the preceding horizontal sync signal, as shown in FIG. 1C. The series of horizontal sync pulses including the false sync pulses are gated by the gate signal whereby the false sync pulses are cancelled.

However, when fast-motion reproduction or slow-motion reproduction is performed by moving a tape at a speed different from that used in recording, the interval between successive horizontal sync signals separated from the reproduced video signal will change correspondingly. As a result, it is impossible to separate accurately the horizontal sync signals from the reproduced video signal when using the conventional TBC circuit.

OBJECTS AND SUMMARY OF THE INVENTION

Accordingly, it is an object of the present invention to provide a periodic pulse forming circuit which can correctly eliminate false sync pulses even when the interval between valid sync pulses is changed, as in slow- and fast-motion reproduction on a VTR.

In accordance with one aspect of the present invention, a circuit for separating periodic pulses from a series of pulses comprises means for generating a first signal of which has an successive portions each having amplitude which corresponds to a respective interval between successive pulses of the series; means for comparing said first signal with reference levels, and for producing a gate signal having a state which is determined by whether or not the amplitude of said first signal is between said reference levels; and means for gating said series of pulses by said gate signal in order to separate said periodic pulses therefrom.

The above, and other objects, features and advantages of the present invention, will be apparent in the followig detailed description of illustrative embodiments thereof which is to be read in connection with the accompanying drawings in which like parts are identified by the same reference numerals in the several views.

DETAILED DESCRIPTION OF PREFERRED EMBODIMENTS

Figure 1:
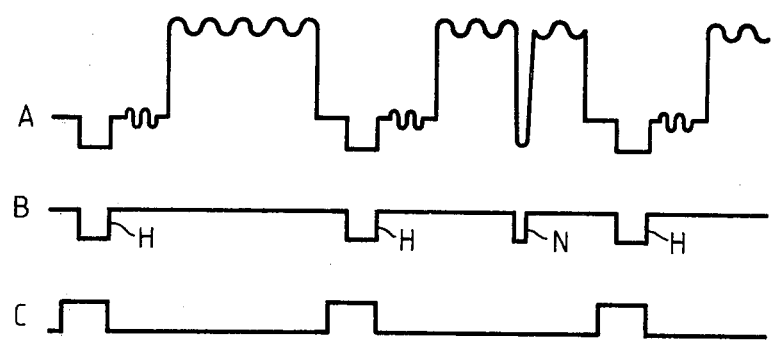
FIGS. 1A-1C are waveforms which illustrate the production of false horizontal sync signals and of a gating signal used in the prior art to eliminate them.
Figure 2:
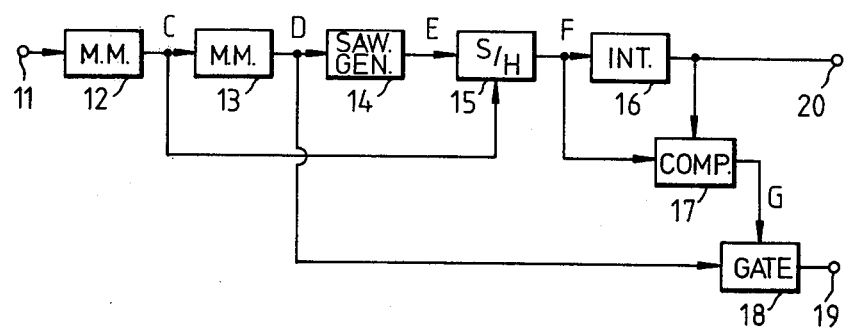
FIG. 2 is a block diagram showing a circuit according to one embodiment of the present invention.
Figure 3:
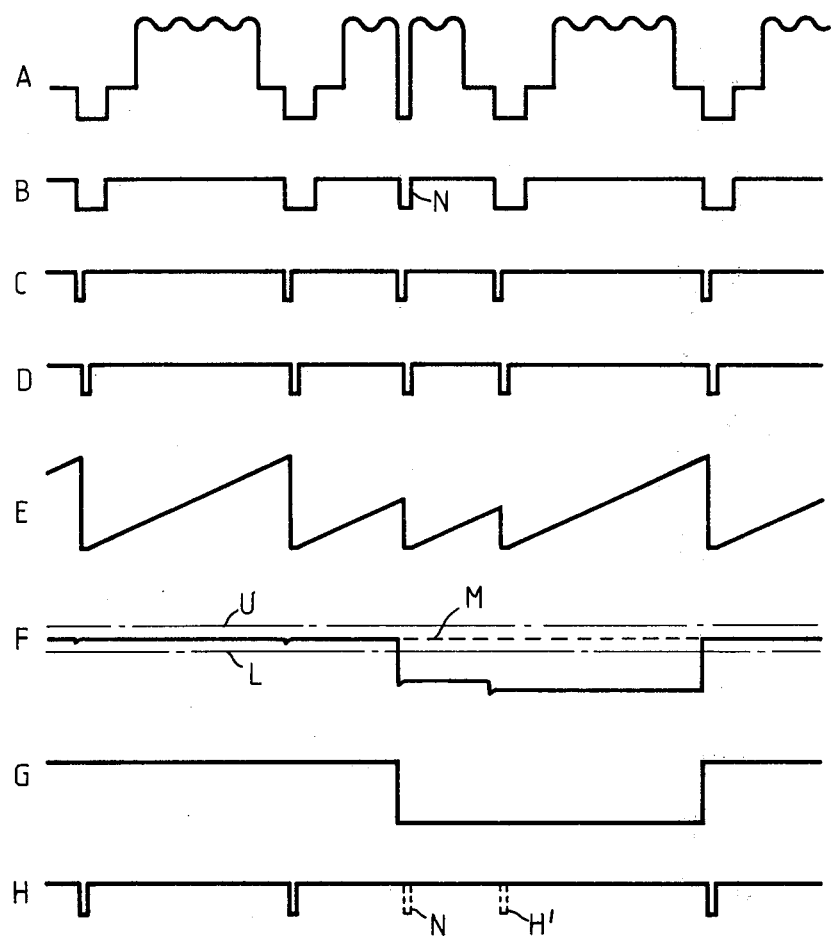
FIGS. 3A to H are waveform diagrams illustrating the operation of the circuit of FIG. 2.

Referring to the drawings in detail and initially to FIG. 2 thereof, it will be seen that a reproduced video signal as shown in FIG. 3A is applied to a horizontal sync double separator to produce the pulse train waveform shown in FIG. 3B and, as stated previously, this pulse train may include false horizontal sync signals which are designated by N in FIG. 3B. This pulse train is applied to the input terminal 11 of the circuitry shown in FIG. 2 to trigger a monostable multivibrator 12 which produces at the leading edge of each pulse of the pulse train second pulse, as shown in FIG. 3C, which is shorter in duration than the pulses comprising the pulse train. The output of the monostable multivibrator 12 is supplied to a second monostable multivibrator 13 and to the control input of a sample and hold circuit 15. The monostable multivibrator 13 produces a third short pulse as shown in FIG. 3D at the trailing edge of each pulse produced by the monostable multivibrator 12. The output of monostable multivibrator 13 is applied to a saw-tooth generator 14 which is reset and triggered thereby and which produces a periodic ramp voltage as shown in FIG. 3E each time it is triggered by the monostable multivibrator 13. The output of the saw-tooth generator is applied to the sample input of the sample and hold circuit 15. The fact that the sampling of the signal produced by saw-tooth generator 14 is controlled by the signal produced by monostable multivibrator 12, as shown in FIG. 3C, means that the output of the sample and hold circuit comprises a series of samples each of which is taken just before each peak of the signal produced by the saw-tooth generator and shown in FIG. 3E. The output of the sample and hold circuit 15 FIG. 3F is applied to an integrating circuit 16 which provides as an output a voltage representing the output of the sample and hold circuit 15 averaged over a period of time equal to several horizontal sync pulse periods measured at the fastest replay rate. The output of the integrator 16 is applied to an input of a window comparator 17 to define a comparison window having upper boundary voltage level U and lower boundary voltage level L which are offset in opposite directions by equal amounts ΔV from a median voltage level M defined by the output of the integrator 16. The output of the sample and hold circuit 15 is applied to the comparison input of window comparator 17 so that the output of the window comparator 17 changes state, as shown in FIG.

3G, each time the output (FIG. 3F) of sample and hold circuit 15 enters or exits the comparison window.

The output from window comparator 17 is used as a gating signal by a gate 18 to gate output of the monostable multivibrator 13 (i.e. the FIG. 3D waveform) to produce the waveform shown in FIG. 3H, from which it will be noted that the false horizontal sync signal N has been eliminated. Gate 18, which produces on output terminal 19 the waveform shown in FIG. 3H, can be used to operate a circuit, such as a monostable multivibrator, which produces a train of horizontal sync pulses corresponding to the valid sync pulses of FIG. 3B.

Thus, in the embodiment of this invention shown in FIG. 2, a first voltage proportional to the average period of the horizontal sync signal is compared with a second voltage proportional to the interval between successive sync pulses. The compared output signal is used as a gate signal by which the series of the horizontal sync pulses is gated to block the false sync signal. Accordingly, even if the average period of the reproduced sync signals varies with a fast-motion or a slow-motion tape reproduction speed, the first voltage also varies in accordance with the change in the average period. As a result, with any tape reproduction speed and thus for any interval between sync pulses, the gate signal is always generated when a false sync pulse appears at the input 11. This means that the false sync pulse is cancelled out in any mode of reproduction. It is further noted that a valid horizontal sync pulse H', as shown in FIG. 3H, immediately following the false sync pulse N is also blocked by the gate signal. However, this is no problem because the periodicity of the horizontal sync signal is still maintained.

Figure 4:
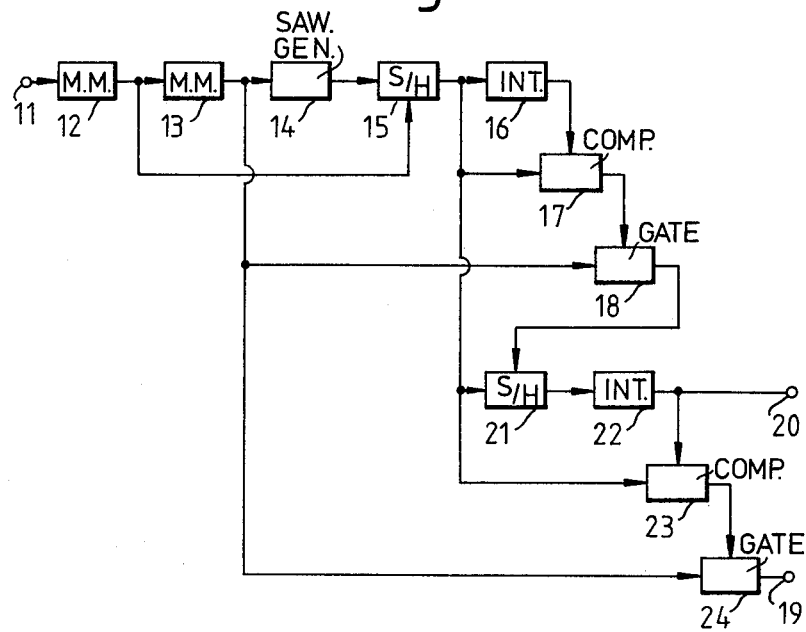
FIG. 4 shows a second embodiment of the invention in block form.

In the second embodiment shown in FIG. 4, circuit elements 11 through 18 respectively correspond to the circuit elements of FIG. 2 which are designated by the same reference numbers, but in addition, circuit elements 21 to 24 are also provided and correspond to circuit elements 15 through 18 respectively of FIG. 2. In the embodiment of FIG. 2, the output signal from integrating circuit 16 is influenced by variations of amplitude in the saw-tooth generator's output signal, so that the average value voltage of the integrating circuits output is somewhat different from what the average value would be if only sampled saw-tooth signals corresponding to valid sync pulses were averaged because portions of the saw-tooth signal corresponding to false sync pulses are also averaged by integrating circuit 16. Further, it is impossible to make the time constant of the integrating circuit relatively large, because when using a slow or fast motion tape reproduction speed the output of the integrating circuit must follow the variation in amplitude of the true saw-tooth signal, that is, the variation in the average period of the horizontal sync signals. As a result, it happens that when the amplitude of the saw-tooth signal changes in response to the noise signals included in the sync signal, the average value of the saw-tooth signal also changes accordingly. Therefore, it is necessary to make the comparison window of the window comparator 17 relatively wide, that is, to set a relatively large predetermined voltage ΔV. However, this means that noise signals occurring close in time to the valid horizontal sync signals cannot be eliminated.

In FIG. 4, the gated synchronizing signal from the gate circuit 18 is supplied as a sampling signal to a second sample and hold circuit 21, to which the sampled signal from the first sample and hold circuit 15 is also supplied as a signal to be sampled. Thus, the sampled signals are again sampled by the gated synchronizing signals, so that only the saw-tooth genertor's output signals which are formed on the basis of the horizontal sync signals are sampled in the second sample and hold circuit 21. Accordingly, the twice sampled signal does not suffer voltage level variations due to noise signals. The twice sampled signal is supplied to a second integrating circuit 22, from which a stable voltage equal to the average value of the twice sampled signal can be obtained. The stable average value voltage is fed to a second window comparator 23 which is operated in the same manner as the first window comparator 17. However, it should be noted that a detecting range of the second window comparator 23 can be narrowed to less than one-third of that of the first window comparator 17.

Figure 5:
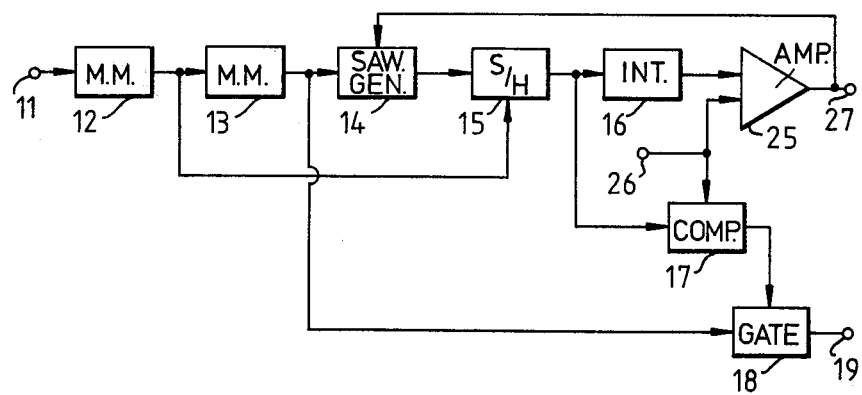
FIG. 5 shows a third embodiment of the invention in block form.

FIG. 5 shows a third embodiment according to this invention, in which the output signal from the integrating circuit 16 is supplied to one terminal of a differential amplifier 25 and a reference voltage from an input terminal 26 is supplied to another terminal of the differential amplifier 25. The output voltage from the differential amplifier 25 corresponds to a difference voltage between the average value voltage developed on the output of the integrating circuit and the reference voltage and is fed back to the saw-tooth signal generator 14. The slope (dV/dt) of the saw-tooth generator's output signal is controlled in accordance with the difference voltage. As a result, the peak amplitude of the saw-tooth generator's output signal is constant regardless of its frequency and is hence insensitive to the change in period of the horizontal sync signal. The saw-tooth signal which has a constant peak amplitude is sampled in the same manner as described above and the sampled signal is supplied to the window comparator 17 whereby the former signal is compared with the reference voltage at terminal 26. When the sampled signal is outside the window range which is formed by the comparator 17 from the reference voltage, the gate signal from the comparator 17 is low. Gate circuit 18 which responds to the gate signal will eliminate the noise signals as previously described. According to this embodiment, the detecting range of the window comparator 17 is determined by the reference voltage, so that the operation of comparing the sampled signal with the reference voltage will be carried out with extremely high stability. The reference voltage at terminal 26 can be made to vary with tape speed.

Figure 6:
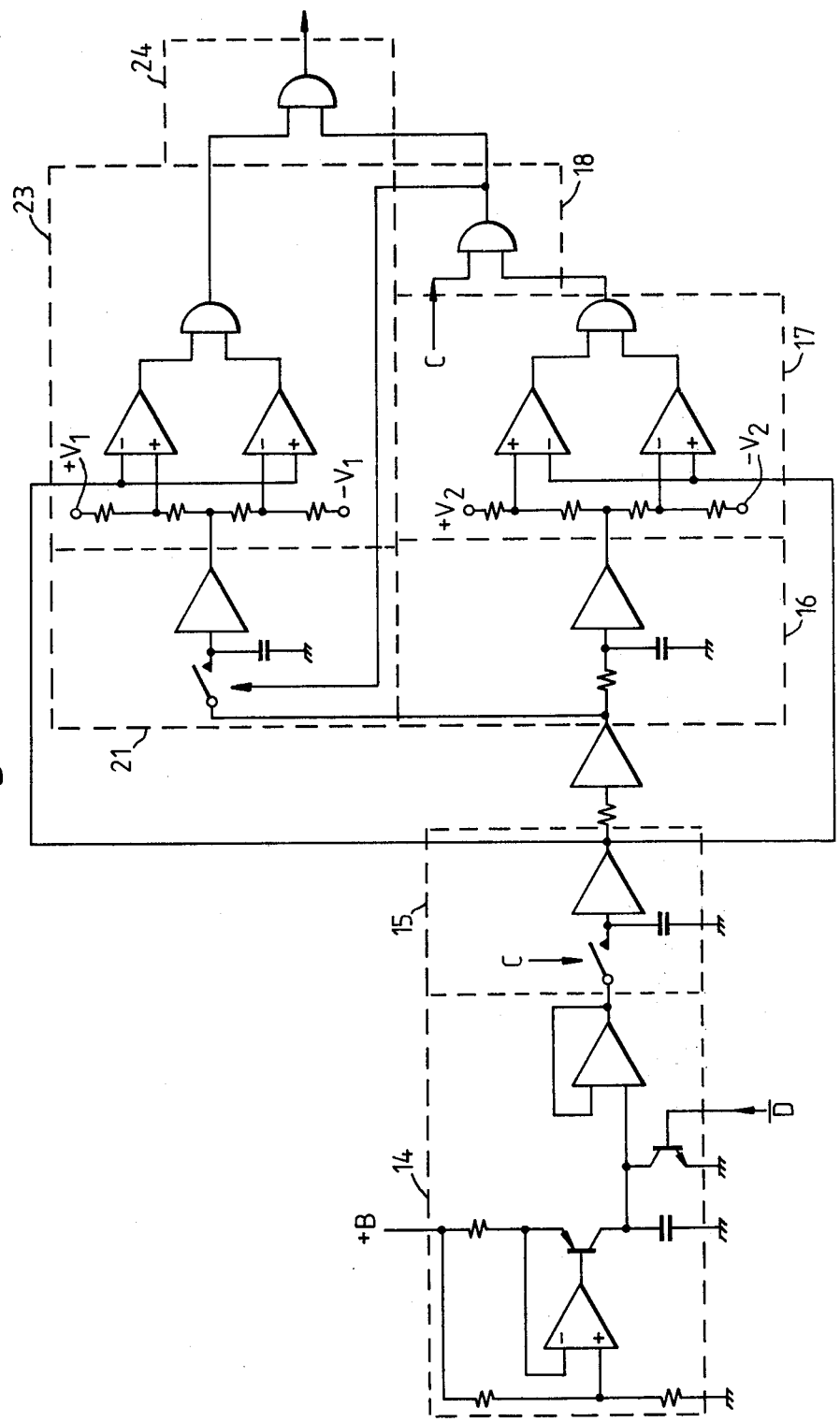
FIG. 6 is a circuit diagram showing the embodiment of FIG. 4 in more detail.

FIG. 6 shows one circuit for implementing the embodiment of FIG. 4 and in which the dashed lines and reference numerals identify the correspondingly numbered circuit blocks shown in FIG. 4. The functioning of the circuit blocks will be immediately apparent to those skilled in the art and so need not be described here. It will be noted that in FIG. 6, the second integrator 22 of FIG. 4 has been omitted and the output of the sample and hold circuit 21 is applied directly to the window-defining input of window comparator 23. This means that the window of comparator 23 is defined by the preceding sample of the output of sample and hold circuit 15 which is sampled by sample and hold circuit 21. This insures that the window of comparator 17 is insensitive to samples from sample and hold circuit 15 which correspond to noise pulses because the sample and hold circuit 21 is allowed to sample only when valid sync pulses are detected.

It will be further noted that comparator circuit 23 shown in FIG. 6 comprises a level shifting circuit which produces two reference levels which are respectively offset by a predetermined value in opposite directions from the output signal of integrating circuit 21.

Although illustrative embodiments of the present invention have been described herein with reference to the accompanying drawings, it is to be understood that the invention is not limited to those precise embodiments and that various changes and modifications may be effected therein by one skilled in the art without departing from the scope or spirit of this invention as defined in the appended claims.

We claim:

1. A circuit for separating periodic pulses from a series of pulses, comprising: means for generating a first signal having successive portions each of which has an amplitude corresponding to a respective time interval between successive pulses of said series of pulses; means for sampling said first signal at times corresponding to the occurrence of each of said successive pulses and producing a sampled signal therefrom; means for producing an average amplitude signal from said sampled signal, averaged over a selected period of time; comparing means for comparing said average amplitude signal with at least one reference level and for producing a gate signal having a state which is determined by the amplitude of said average amplitude signal in relation to said at least one reference level; and means for gating said series of pulses by said gate signal so as to separate said periodic pulses therefrom.

2. A circuit according to claim 1, in which said comparing means includes means for producing said at least one reference level.

3. A circuit according to claim 2, in which said means for producing said average amplitude signal includes means for integrating said sampled signal such that said average amplitude signal has an amplitude which corresponds to the average interval between successive pulses of said series.

4. A circuit according to claim 3, in which said means for producing said at least one reference level further comprises level shifting means to which said average amplitude signal is supplied, said level shifting means producing a pair of reference levels which are respectively offset by a predetermined value in opposite directions from the level of said average amplitude signal.

5. A circuit according to claim 1, in which said means for generating said first signal includes means for generating a saw-tooth signal which is reset at times when pulses of said series are applied thereto.

6. A circuit according to claim 5, wherein said at least one reference level is derived from samples of the saw-tooth signal, each of said samples corresponding to one of said periodic pulses of said series of pulses only.

7. A circuit according to claim 6, which further comprises second sampling means connected to said first means for sampling said saw-tooth signal to sample the output of said first means for sampling said saw-tooth signal upon the occurrence of said periodic pulses.

8. A circuit according to claim 1, wherein said successive portions of the first signal have substantially equal maximum amplitudes, and further comprising means for sampling said first signal at substantially the same time in each cycle of said first signal.

9. A circuit according to claim 8, wherein said means for generating said first signal includes means for producing a slope control signal, said slope control signal corresponding to the difference between the average amplitude of said successive portions of the first signal and a reference signal, and means for controlling the slope of said successive portions of said first signal in response to said slope control signal.

10. A circuit for separating periodic pulses from a series of pulses, comprising:
   means connected to said series of pulses for producing a continuous average amplitude signal having a varying amplitude that is representative of respective time intervals between successive pulses of said series of pulses, averaged over a preselected period of time;
   selectively operable comparison means connected to said continuous average amplitude signal having predetermined upper and lower amplitude limits for producing a gate signal having a state determined by a comparison of said continuous average amplitude signal with said predetermined upper and lower amplitude limits and being selectively operable only at times corresponding to the occurrence of pulses in said series of pulses; and
   gating means responsive to said gate signal for gating said series of pulses so as to separate said periodic pulses therefrom.

11. A circuit for separating periodic pulses from a series of pulses according to claim 10, in which said means for producing a continuous average amplitude signal includes means for generating a first signal having successive portions each of which has an amplitude corresponding to a respective time interval between successive pulses of said series of pulses.

12. A circuit for separating periodic pulses from a series of pulses according to claim 11, in which said means for producing a continuous average amplitude signal includes means for sampling said first signal at times corresponding to the occurrence of each of said successive pulses and producing a sampled signal therefrom.

13. A circuit for separating periodic pulses from a series of pulses according to claim 12, in which said means for producing a continuous average amplitude signal includes means for integrating said sampled signal such that such said continuous average amplitude signal has an amplitude that corresponds to the average interval between successive pulses of said series.

* * * * *